United States Patent [19]
Prigge et al.

[11] Patent Number: 4,973,563
[45] Date of Patent: Nov. 27, 1990

[54] PROCESS FOR PRESERVING THE SURFACE OF SILICON WAFERS

[75] Inventors: Helene Prigge, Unterschleissheim; Anton Schnegg, Burghausen; Gerhard Brehm, Emmerting, all of Fed. Rep. of Germany

[73] Assignee: Wacker Chemitronic Gesellschaft, Burghausen, Fed. Rep. of Germany

[21] Appl. No.: 368,579

[22] Filed: Jun. 20, 1989

[30] Foreign Application Priority Data

Jul. 13, 1988 [DE] Fed. Rep. of Germany ....... 3823765

[51] Int. Cl.$^5$ .................. H01L 21/302; H01L 21/463
[52] U.S. Cl. ..................................... 437/225; 427/299
[58] Field of Search ............... 437/225, 946, DIG. 17, 437/DIG. 28; 427/299, 444

[56] References Cited

U.S. PATENT DOCUMENTS

| 3,874,129 | 4/1975 | Deckert et al. | 51/283 |
| 3,942,982 | 3/1976 | Yanazawa et al. | 430/327 |
| 4,599,243 | 7/1986 | Sachdev et al. | 437/245 |
| 4,608,097 | 8/1986 | Weinberger et al. | 427/155 |
| 4,724,171 | 3/1988 | Lampert et al. | 427/299 |
| 4,847,159 | 7/1989 | Glajch et al. | 428/429 |
| 4,883,775 | 11/1989 | Kobayashi | 437/946 |

Primary Examiner—Olik Chaudhuri
Assistant Examiner—Trung Dang
Attorney, Agent, or Firm—Collard, Roe & Galgano

[57] ABSTRACT

A process for preserving the surface of silicon wafers after the wafers are polished in a conventional polishing operation by converting the wafer surface to the hydrophobic state, in particular, by polishing, or with hydrofluoric acid and treating immediately afterwards with a reagent, e.g., alcohols, organosilanes or silanols and preferably in aqueous solution. The wafer becomes coated in this process with a protective layer which inhibits surface deterioration, and also permits long storage times.

8 Claims, No Drawings

PROCESS FOR PRESERVING THE SURFACE OF SILICON WAFERS

The invention relates to a process for preserving the polished surface of silicon wafers by depositing protective layers.

After silicon wafers are polished in a conventional polishing operation to produce a relatively perfect surface, the wafer surface becomes exposed to many influences which may deteriorate its surface quality. As an example, polishing agent residues, rinsing water, cleaning solutions, or the ambient atmosphere can deteriorate the water surface. These effects are especially operative in doublesided polishing, where the removal of wafers after termination of the polishing operation is relatively time-consuming.

Following a polishing operation, the silicon wafers are usually subjected, to an oxidizing cleaning, for example, by immersion in an ammonia/hydrogen peroxide solution, in order to prevent or eliminate deteriorations of this type in the surface quality. The oxide layer formed in this process may, however, again be, in turn, subject to ageing effects. This may cause, e.g., in subsequent thermal oxidation steps, the formation of a fog-like cloudiness, described as "haze", on the polished surface, which becomes visible on the wafer surface as a diffuse reflection.

German patent DE-A-3,540,469 or, alternatively, the corresponding U.S. Pat No. 4,724,171 proposed subjecting the silicon wafers first to an oxidative or oxidizing cleaning following the polishing operation, and the treating the surface with hexamethylidislazane. The protective action achieved is due to the fact that the OH groups present on the oxidized silicon surface react to bring about trimethylsilyation, so that a thin protective film forms on the surface and protects the polished wafer from the harmful effects. This process does not, however, completely prevent defects, such as, for example, etching pits and the like from being completely removed or being entrained under the protective film. These defects are produced on the wafer surface in the period between the termination of the polishing operation and the start of the oxidizing cleaning.

It is therefore an object of the present invention to provide a process which can be widely used and effectively preserves the wafer surface, not only in the phase between the termination of the polishing operation and the start of the subsequent cleaning steps, but also, optionally, following a cleaning treatment of the wafters.

This object is achieved by a process embodying the present invention which comprises producing a hydrophobic wafer surface in a first step, and then treating the surface with a reagent selected from the group comprising the aliphatic alcohols, organosilanes or, in particlar, silanols.

Characteristic of the surface of hydrophobic silicon wafers is the presence of mainly Si—H and Si—CH$_x$ groups oxygen is essentially not present. This state of affairs is explained in more detail in a papar by M. Grundner and H. Jacob entitled "Investigations on Hydrophilic and Hydrophobic Silicon (100) Wafer Surfaces by X-Ray Photoelectron and High-Resolution Electron Energy Loss-Spectroscopy", *Appl. Phys.* A 39, pages 73ff. (1986).

Two main methods are possible for producing such essentially oxide-free wafer surfaces exhibiting silicon-hydrogen bonds. On the one hand, in the case of silicon wafers exhibiting an oxided layer on their surface, they may be treated with aqueous or gaseous hydrofluoric acid. The acid serves to strip the oxidic substituents leaving a surface covered with Si-H bonds mainly.

The treatment may, for example, be carried out by immersing the wafers in an aqueous bath containing hydrofluoric acid and leaving them there until the oxide layer is largely or completely stripped. It is also possible, for example, to spray or to rinse the wafer surface with hydrofluoric acid. Advantageously, the excess hydrofluoric acid is then removed by washing off with deionized water. Suitable process sequences and process variables are referred to, for example, in the above-mentioned paper and are also known from the standard cleaning processes in which a sequence of different wet-chemical treatment steps, generally including also one or more hydrofluoric acid treatments, act on the surface of polished wafers. As an example, a suitable process is described by W. Kern and D. Puotinen in *RCA Review*, June 1970, pages 187–206. These known methods and conditions for treating with hydrofluoric acid, for example, as regards concentrations, temperatures, type and duration of action, may also be used analogously in the process according to the invention.

The second main method, and the one preferred within the scope of the invention, is to subject the silicon wafer to a chemomechanical polishing step. Such a step may at the same time be carried out in the manner which is known and standard within the scope of wafer production; possible embodiments are, for example, illustrated in a paper by E. Mendel which appeared in *Solid State Technology* 10 (27), 1967, pages 27–39 or in the patent literature, for example, in U.S. Pat. Nos. 4,070,799; 3,874,129; 4,270,316; or 4,739,589 and also in the publications cited therein. The polishing operations may be single-stage or multistage and may also be performed as single-sided or double-sided processes, the method suitable in each case being selected in accordance with the intended subsequent processing of the wafers. In many cases, processes have proved successful in which alkaline polishing agents containing silica sol are applied to the polishing pad moved over the wafer surface during the polishing operation.

The production of a hydrophobic wafer surface with the aid of a polishing operation has the advantage that the subsequent second step, which effects the preservation itself, can be added on without interrupting the process and carried out in the polishing equipment itself. This makes it possible to provide the relatively perfect and hydrophobic surface formed by polishing with a protective layer immediately and without an intermediate phase which possibly effects deterioration thereof. This is especially applicable in the case of double-sided polishing, in which the removal of the wafers after termination of polishing is relatively time-consuming. In priniple, it is, however, equally possible to subject the wafers first to other processes after the polishing step and to convert the wafer surface to the hydrophobic state only subsequent thereto in the manner described above by means of hydrofluoric acid.

In addition to these two main methods, other different, but usually more expensive processes, such as, for instance, plasma etching, reactive ion etching or epitaxial processes such as molecular beam epitaxy, homogeneous and heterogeneous gas-phase deposition on liquid-phase epitaxy, are in principle also possible for producing hydrophobic wafer surfaces.

Preferably aqueous solutions which contain aliphatic alcohols, organosilanes or, in particlar, silanols as reagent, both mixtures of different compounds and also, preferably, individual compounds being suitable, are used for the second process step to treat the wafer surface. In this connection, it has proved particularly advantageous to always select those reagents whose solubility in water ensures, on the one hand, at the point of use, i.e. on the water surface, an adequate quantity of reagent is made available but that it is also released from the aqueous phase to an extent sufficient for it to be able to interact with the surface and to be bound by it. In this connection it was found that these requirements are best met by those reagents which are miscible with water to a proportion of approx. 15% by volume, preferably up to about 8% by volume, based on the total quantity in each case.

In addition to the use of aqueous solutions, it may also be possible in some cases to allow the reagents to act on the wafer surface in the gaseous state, for example, in gassing chambers and, beneficially, subsequent to epitaxial or plasma etching processes.

For operational safety reasons, those reagents are advantageously selected which have as low as possible vapor pressure as possible in order to minimize the risk of the formation of ignitable mixtures or a health hazard to the operating staff as a result of inhaling harmful vapors.

Advantageously, use is made of solutions whose proportion of reagent is adjusted to 0.1 to 10% by volume, preferably 0.2 to 5% by volume. In principle, instead of homogeneous phases, use may also be made of two-phase mixtures in which an aqueous and an organic phase exist side by side, for example as an emulsion or a dispersion. As a rule, the application temperatures are between 10° and 80° C., preferably 20° and 50° C.

Suitable reagents from the group comprising the aliphatic alcohols are, for example, straight-chain monohydric alkanols such as ethanol, propanol or butanol. Dihydric alcohols such as, for instance, ethylene glycol or trihydric alcohols such as, for instance, glycerol may also be used. Higher organosilanes of the formula $R_3SiOH$, $R_2Si(OR')_2$, $HO(SiR_2O)_n$, where $R=CH_3$, $C_2H_5$, $C_3H_7$, $R'=CH_3$, $C_2H_5$ and $n=10-15$ may equally be used. Preferably, use is made of trialkylsilanols which contain ethyl and/or propyl groups, but with particular advantage also or only methyl groups, as alkyl groups. The best results are achieved with trimethylsilanol as reagent, the concentration range from approx. 0.2 to 5% by volume having proved particlarly beneficial. The advantage of trialkylsilanols, in particular of trimethylsilanol, is that particularly low proportions of etching stains are to be observed if they are used and that, owing to the lack of odor and low volatility, they are extremely easy to handle.

The silicon wafers hydrohobized, according to the preferred embodiment of the invention, by polishing can advantageously be treated by leaving the wafers in the polished machine after completion of the polishing operation and rinsing them with the aqueous solution containing the reagent selected in the particular case immediately after terminating the supply of polishing agent. In this connection, the solution may be suppied via a separate pipe and pump system or, alternatively, via the polishing agent feed pipes. Advantageously, the quantity of solution supplied in this rinsing operation in unit time is increased compared with the quantity of polishing agent previously supplied in order to treat all the wafers as rapidly as possible and at the same time to expel polishing agent residues from the surface of the polishing pad, an increase by 1.5 to 20 fold having proved adequate in most cases.

The polishing operation can, in principle, be terminated in a manner such that the polishing machine and the polishing agent supply are stopped. Preferably, the polishing operation is, however, terminated by modifying, while supplying the solution, one or more process variables with the machine otherwise continuing to run in manner such that the polishing action ceases completely or turns to zero. This can be effected partcularly advantageously by markedly reducing the polishing pressure, partcularly beneficially, to the range below 0.1 bar, preferably below 0.06 bar. This procedure has the advantage that, as a result of the continued relative movement between wafers and polishing equipment, the solution supplied is particularly rapidly distributed over the wafer surfaces and is consequently able to take effect quickly.

The surface of wafers which have been treated in the first step by means of hydrofluoric acid may advantageously be preserved by immersion in a bath containing the solution selected in the particlar case and possibly also thermostated. Other possibilities are to deposit the solution on the wafer surfaces by spraying or rinsing. In principle, the statements already made previously in connection with hydrofluoric acid treatment apply to these suitable procedures.

Regardless of how the silicon wafers were provided with a hydrophobic surface in the first step, a treatment time of a few, preferably 0.3 to 10, minutes is found by experience to be sufficient in most cases for the step subsequent thereto. The wafers subsequently obtained have a hydrophobic surface, i.e. they are not wetted by water, can therefore no longer be attacked by corrosive aqueous phases and are also protected at the same time against the effects of the ambient atmosphere.

The preservative protective layer formed on the wafer surface can be removed by an oxidizing treatment before subsequent further manufacturing steps and converted into an oxidic layer. Such an oxidation may, for example, be carried out in an oxygen atmosphere at 800° to 1200° C. In principle, an electrochemical or wet-chemical oxidation step, for example with the agents known from cleaning processes such as ammonia/hydrogen peroxide solution, is also possible. Oxidic layers are in any case produced in most further manufacturing processes in the first process step so that the latter are ultimately not disturbed by the protective layer.

The process according to the invention is used with particular advantage for preserving polished silicon wafers in the intermediate phase between polishing and subsequent final cleaning; the wafers treated in this manner can in fact be transported easily and without the risk of surface quality deteriorations and/or stored over a period of months. It consequently also makes possible a greater in-house flexibility in the polishing-final cleaning process sequence. Further possible applications are in the preliminary treatment of silicon wafers intended for epitaxy, and also in the preservation of wafer surfaces which are in the hydrophobic state.

The invention will now be explained more fully in a number of examples which are, however, only given by way of illustration and not of limitation.

EXAMPLE 1

36 silicon wafers (diameter approx. 150 mm, thickness approx. 650 μm, (100) orientation) were polished for approx. 30 min. in a commercial apparatus for double-sided polishing of semiconductor wafers. During the polishing operation, a commercial alkaline polishing solution containing an SiO$_2$ sol was applied to the polishing cloth; the temperature was adjusted to approx. 40° C. and the polishing pressure was approx. 0.5 bar.

With the machine continuing to run, the pressure was then reduced until the operation took place without pressure, i.e. only with the pressure exerted by the dead weight of the parts of the apparatus resting on the wafers, and at the same time, instead of the polishing agent, an aqueous solution containing approx. 1% by volume of trimethylsilanol and adjusted to approx. 40° C. was fed onto the polishing cloth at a supply rate of about 20 l/min. This treatment step was terminated after about 3 min. and the apparatus was stopped. The wafers were removed, rinsed with deionized water and dried. In these circumstances, the wafers exhibited hydrophobic behavior, i.e. they were not wetted by the water. All the wafers were then examined under the microscope in collimated light. All the surfaces proved to be perfect and did not exhibit either etching stains or fine polishing scratches.

In a comparison experiment, 36 further silicon wafers were subjected to the same sequence of processing steps, with the difference that during the 3-minute pressure-free treatment, only deionized water was fed onto the polishing cloth, and in particular, again at a supply rate of 20 l/min.

On examination under the microscope in collimated light, these wafers frequently exhibited faintly visible round stains having diameters of up to 10 μm which proved to be etching stains. In addition, it was frequently possible to observe very fine scatches which apparently originated from the final phase of the polishing operation.

EXAMPLE 2

In an analogous manner to the process described in Example 1 and while maintaining the same process variables, 36 silicon wafers of the same specification were again provided with a hydorphobic surface by double side polishing.

In the second treatment step, however, the polishing machine was allowed to continue to run for 10 min. without pressure, and an aqueous solution containing 5% by volume of n-butanol was applied to the polishing cloth at approx. 18 l/min.

The wafers were then rinsed with deionized water and dried; in these circumstances, they exhibited hydrophobic behavior. On subsequent examination under the microscope in collimated light, neither ethching stains nor fine scratches could be detected.

EXAMPLE 3

With a working procedure otherwise corresponding to the previous example, the 10-minutes pressure-free second treatment step was carried out while supplying an aqueous solution containing 0.1% by volume of tripropylsilanol. After removal, rinsing with deionized water and drying, the wafers did not exhibit either etching stains or fine polishing scratches on examination under the microscope in collimated light.

EXAMPLE 4

50 silicon wafers (diameter approx. 100 mm, thickness about 525 μm, (100) orientation) polished on one side were stored in a standard semiconductor package for a period of several weeks and had become coated during this storage with a thin surface oxide layer ("native oxide"). These wafers were then subjected to a cleaning by first spraying them for approx. 5 min. with a roughly 2% by weight aqueous hydrofluoric acid solution in a commercial spray-cleaning chamber in order to remove the oxide and to produce a hydrophobic wafer surface. This was follwed by an approx. 1-minute rinse deionized water.

25 wafers were then sprayed in a second treatment step for about 3 min. with an aqueous solution containing approx. 1% by volume of trimethylsilanol and then again with deionized water for about 1 min.

The other 25 wafers were further sprayed in the second step for approx. 4 min. only with deionized water.

Both groups of wafers were then dried and stored for one week in air with an atmospheric humidity of 45%. Whereas the formation of small stains (diameter approx. 2 μm) set in after only 3 days on the wafers treated only with water, the wafers treated with the trimethylsilanol solution were still completely stain-free even after a week.

Thus, while only several examples and comparison examples have been described, it is obvious that many changes and modifications may be made thereunto, without departing from the spirit and scope of the invention.

What is claimed is:

1. A process for preserving the surface of silicon wafers by depositing a protective layer, which comprises the steps of:
    producing a hydrophobic wafer surface and,
    treating the surface with a reagent selected from the group consisting of an aliphatic alcohol, an organo silane, a silanol and a combination thereof, in a step subsequent thereto.

2. The process of claim 1, wherein said producing a hydrophobic wafer surface step comprises treating said wafer surface in a chemomechanical polishing operation.

3. The process of claim 1, wherein said producing a hydrophobic wafer surface step comprises treating said wafer surface with hydrofluoric acid.

4. The process of claim 1, wherein said reagent is used in aqueous solution.

5. The process of claim 4, wherein the proportion of the reagent in the solution is adjusted to 0.1 to 10% by volume, based on the total quantity.

6. The process of claim 4, wherein a reagent is selected which is miscible with water up to a proportion of 15% by volume, based on the total quantity.

7. The process of claim 1, wherein said reagent is a trialkylsilanol.

8. The process of claim 7, wherein said reagent is trimethylsilanol.

* * * * *